(12) United States Patent
Matsushita et al.

(10) Patent No.: US 9,876,011 B2
(45) Date of Patent: Jan. 23, 2018

(54) SEMICONDUCTOR DEVICE

(71) Applicant: Kabushiki Kaisha Toshiba, Minato-ku, Tokyo (JP)

(72) Inventors: Kenichi Matsushita, Nonoichi Ishikawa (JP); Kazutoshi Nakamura, Nonoichi Ishikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/256,938

(22) Filed: Sep. 6, 2016

(65) Prior Publication Data
US 2017/0148786 A1 May 25, 2017

(30) Foreign Application Priority Data

Nov. 20, 2015 (JP) ................... 2015-227661

(51) Int. Cl.
| | |
|---|---|
| *H01L 29/872* | (2006.01) |
| *H01L 27/06* | (2006.01) |
| *H01L 29/10* | (2006.01) |
| *H01L 29/40* | (2006.01) |
| *H01L 29/66* | (2006.01) |
| *H01L 29/739* | (2006.01) |

(52) U.S. Cl.
CPC ...... *H01L 27/0664* (2013.01); *H01L 29/1095* (2013.01); *H01L 29/401* (2013.01); *H01L 29/407* (2013.01); *H01L 29/408* (2013.01); *H01L 29/66143* (2013.01); *H01L 29/66348* (2013.01); *H01L 29/7397* (2013.01); *H01L 29/872* (2013.01)

(58) Field of Classification Search
CPC . H01L 29/872; H01L 29/66143; H01L 29/47; H01L 29/00; H01L 27/0814
See application file for complete search history.

(56) References Cited

U.S. PATENT DOCUMENTS 6,175,143 B1    1/2001  Fujihira et al.
8,896,084 B2 *  11/2014 Sugawara ........... H01L 29/0615
                                                    257/471

(Continued)

FOREIGN PATENT DOCUMENTS

JP        2010-267863 A      11/2010

*Primary Examiner* — Quoc Hoang
(74) *Attorney, Agent, or Firm* — White & Case LLP

(57) ABSTRACT

A semiconductor device comprising:
a first semiconductor region of a first conductivity type;
a second semiconductor region of a second conductivity type provided on the first semiconductor region;
an insulating portion provided on the first semiconductor region;
a third semiconductor region of the second conductivity type provided on the second semiconductor region and having a higher carrier concentration of the second conductivity type than that of the second semiconductor region; and
a first electrode provided on the insulating portion and the third semiconductor region, the first electrode having a portion which is aligned with the second semiconductor region in a second direction perpendicular to a first direction being from the first semiconductor region to the second semiconductor region, and the first electrode being in contact with the second semiconductor region and the third semiconductor region.

18 Claims, 8 Drawing Sheets

(56) References Cited

U.S. PATENT DOCUMENTS

2009/0272982 A1* 11/2009 Nakamura ........ H01L 29/66848
                                                    257/77
2014/0124832 A1    5/2014 Ogura et al.

* cited by examiner

SEMICONDUCTOR DEVICE

CROSS-REFERENCE TO RELATED APPLICATIONS

This application is based upon and claims the benefit of priority from Japanese Patent Application NO. 2015-227661 filed on Nov. 20, 2015, the entire contents of which are incorporated herein by reference.

FIELD

Embodiments described herein relates generally to semiconductor devices.

BACKGROUND

A diode is a semiconductor device widely used in, for example, a power conversion circuit. When the semiconductor device is switched from an ON state to an OFF state, carriers accumulated in the semiconductor device are discharged outside. It is desirable that a time required to discharge the carriers outside (recovery time) be short.

DETAILED DESCRIPTION

Figure 1:
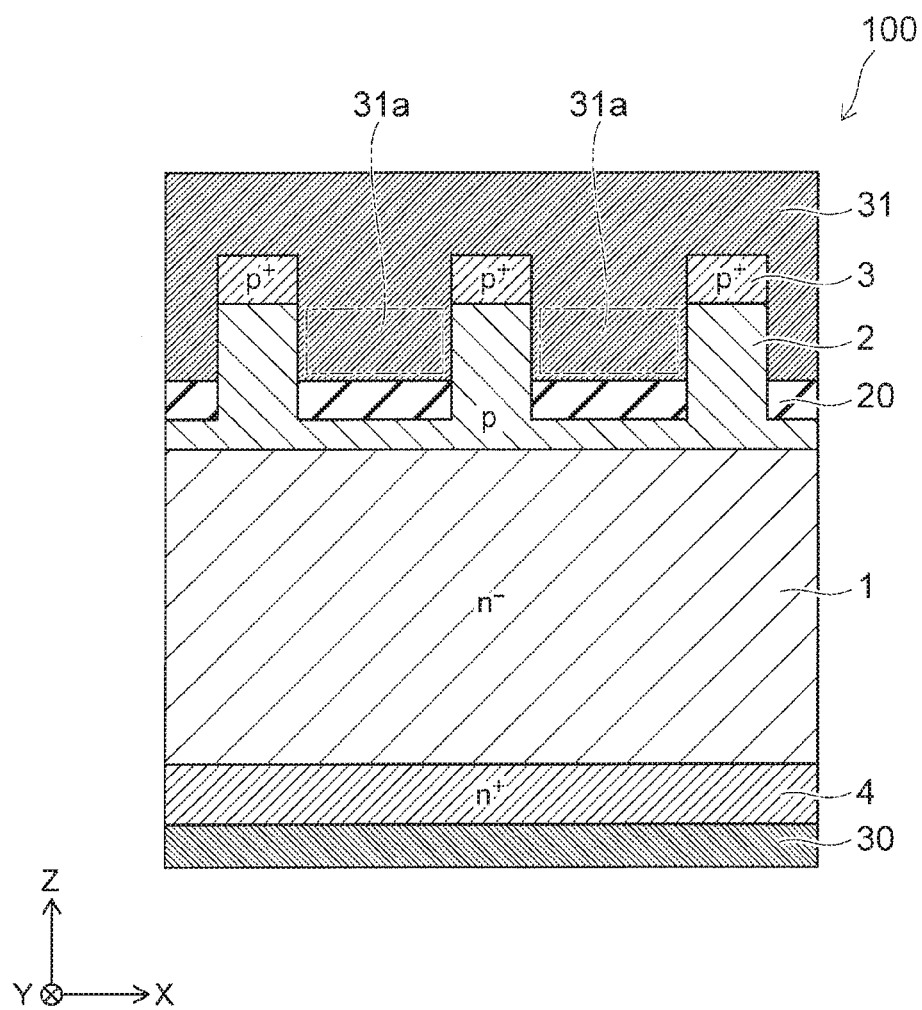
FIG. 1 is a sectional view of a semiconductor device according to a first embodiment.

Exemplary embodiments will be described below with reference to the accompanying drawings.

The drawings are schematic or conceptual; and the relationships between the thickness and width of portions, the proportions of sizes among portions, and the like are not necessarily the same as the actual ones thereof. Further, the dimensions and proportions may be illustrated differently among drawings, even for identical portions.

Moreover, the same or corresponding elements in the drawings and the following description are denoted with the same reference numerals, and a repeated detailed description is omitted as appropriate.

An XYZ orthogonal coordinate system is used for explaining the embodiments. Z direction (first direction) is defined as a direction from an n$^-$ type semiconductor region 1 to a p type anode region 2. X direction (second direction) and Y direction are defined as a direction perpendicular to the Z direction and they are in a mutually orthogonal relation.

In the description, the symbols n$^+$, n, and n$^-$ and p$^+$, p, and p$^-$ represent a relative level of an impurity concentration of each conductivity type. That is, the symbols with "+" represents a relatively higher impurity concentration than the symbols to which neither "+" nor "−" is given and the symbols with "−" represents a relatively lower impurity concentration than the symbols to which neither "+" nor "−" is given.

In implementing each embodiment described below, the p type and the n type of each semiconductor region may be reversed.

First Embodiment

At first, an example of a semiconductor device according to a first embodiment will be described with reference to FIG. 1 and FIG. 2.

FIG. 1 is a sectional view of a semiconductor device 100 according to the first embodiment.

Figure 2A:
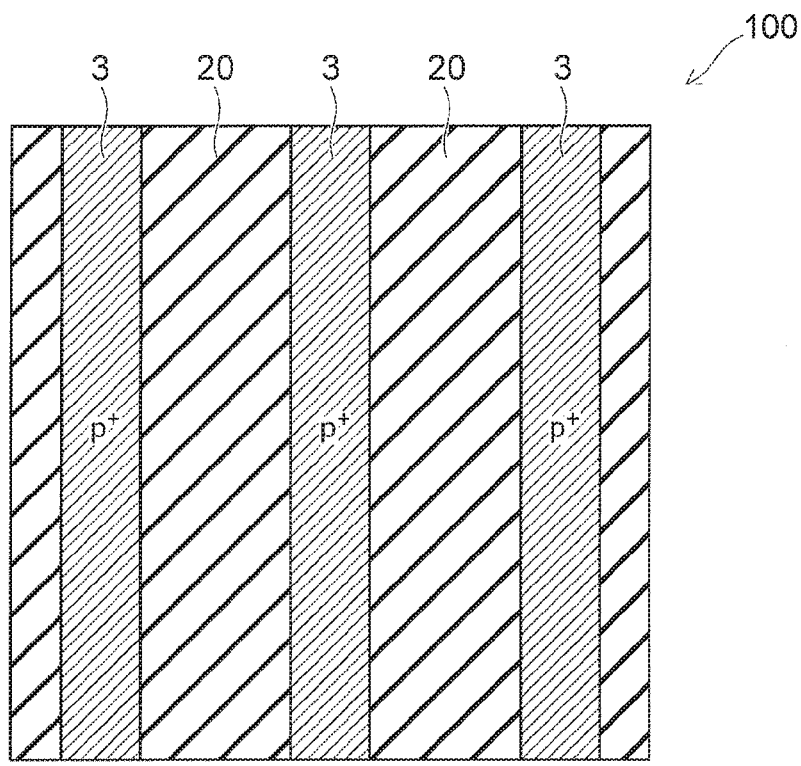
FIGS. 2A and 2B are plan views of the semiconductor device according to the first embodiment.
Figure 2B:
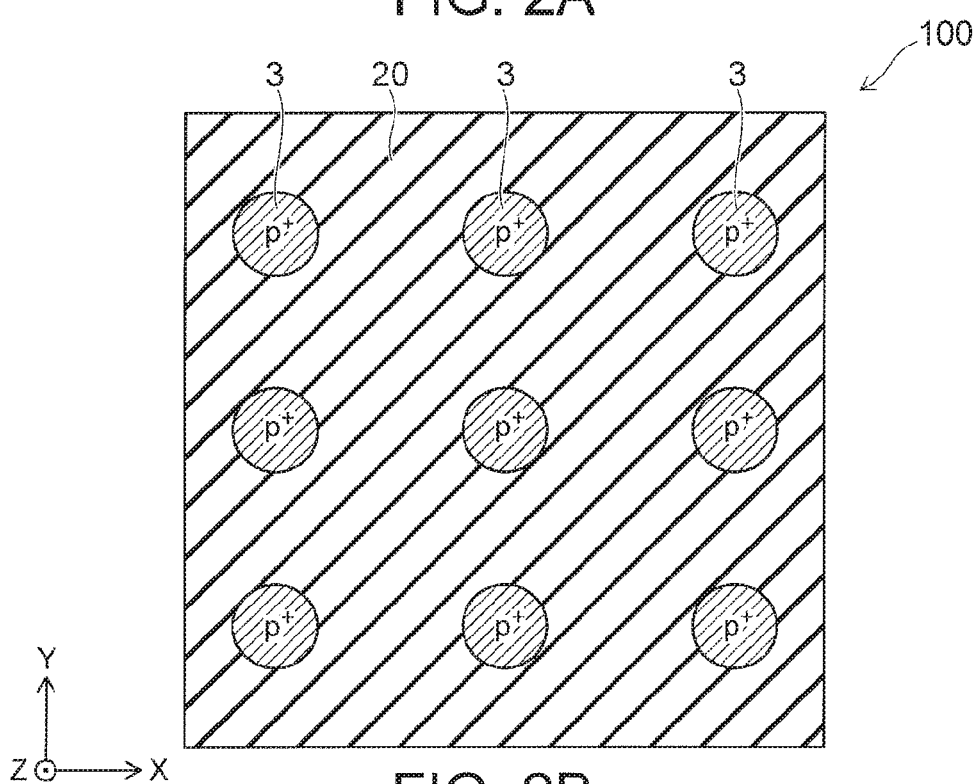

FIGS. 2A and 2B are plan views of the semiconductor device 100 according to the first embodiment.

In FIGS. 2A and 2B, an anode electrode 31 is not shown.

The semiconductor device 100 may be, for example, a diode.

As shown in FIG. 1, the semiconductor device 100 includes an n$^+$ type (for example, first conductivity type) cathode region 4, n$^-$ type semiconductor region 1 (first semiconductor region), a p type (for example, second conductivity type) anode region 2 (second semiconductor region), a p$^+$ type anode region 3 (third semiconductor region), an insulating portion 20, a cathode electrode 30 (first electrode), and the anode electrode 31.

The cathode electrode 30 is provided on a back side of the semiconductor device 100.

The n$^+$ type cathode region 4 is provided on the cathode electrode 30 and is electrically connected to the cathode electrode 30.

The n$^-$ type semiconductor region 1 is provided on the n$^+$ type cathode region 4.

The p type anode region 2 is provided on the n$^-$ type semiconductor region 1.

A part of the p type anode region 2 extends in a Z direction.

The insulating portion 20 is provided on another part of the p type anode region 2. The insulating portion 20 is aligned, in an X direction, with a portion of the p type anode region 2 which extends in the Z direction.

FIG. 1 should be considered only as exemplary, and not be limiting. The p type anode region 2 may be provided on only a part of the n$^-$ type semiconductor region 1 and the insulating portion 20 may be provided on another part of the n$^-$ type semiconductor region 1. In other words, the p type anode region 2 may not be provided between the insulating portion 20 and the n$^-$ type semiconductor region 1.

The p$^+$ type anode region 3 is provided on the p type anode region 2.

The anode electrode 31 is provided on the p$^+$ type anode region 3 and the insulating portion 20. The anode electrode 31 has a portion 31a which is aligned with the p type anode region 2 in the X direction. The anode electrode 31 is in contact with the p type anode region 2 and the p$^+$ type anode region 3. In other words, the anode electrode 31 is in contact with the side surfaces of the p type anode region 2 and the side surfaces and the upper surface of the p$^+$ type anode region 3. More particularly, the anode electrode 31 is in schottky contact with the p type anode region 2 and in ohmic contact with the p$^+$ type anode region 3.

As shown in FIG. 2A, the p$^+$ type anode region 3 is one of a plurality of p$^+$ type anode regions 3 provided in the X direction and each p$^+$ type anode region 3 extends in a Y direction. Alternatively, the plurality of p$^+$ type anode regions 3 may be provided in the X direction and in the Y direction, as shown in FIG. 2B.

In the examples shown in FIG. 2A and FIG. 2B, an interface between the p type anode region 2 and the anode electrode 31 is under an outer edge of the p$^+$ type anode region 3 (in a −Z direction side). When the plurality of p$^+$ type anode regions 3 are provided in the X direction and in the Y direction as shown in FIG. 2B, an area of the p$^+$ type anode region 3 can be reduced. Moreover, a total area of the p$^+$ type anode regions 3 can be reduced and simultaneously a contact area between the p type anode region 2 and the anode electrode 31 can be increased by adjusting the number of the p$^+$ type anode regions 3.

Examples of materials for each element will now be described.

The n$^+$ type cathode region 4, the n$^−$ type semiconductor region 1, the p type anode region 2, and the p$^+$ type anode region 3 include silicon, silicon carbide, gallium nitride, or gallium arsenide as a semiconductor material.

Arsenic, phosphorus, or antimony can be used as n type impurities added to the semiconductor material. Boron can be used as p type impurities.

The insulating portion 20 includes insulating material, such as silicon oxide.

The cathode electrode 30 and the anode electrode 31 include metal, such as aluminum.

Next, an example of a method for manufacturing the semiconductor device 100 according to the first embodiment will be described with reference to FIGS. 3 to 5.

Figure 3A:
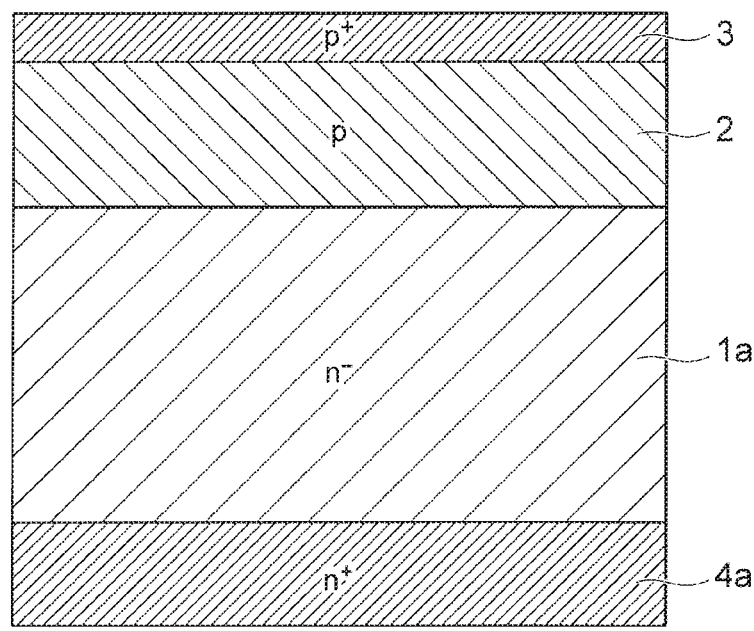
FIGS. 3A and 3B are sectional views showing steps of manufacturing the semiconductor device according to the first embodiment.
Figure 3B:
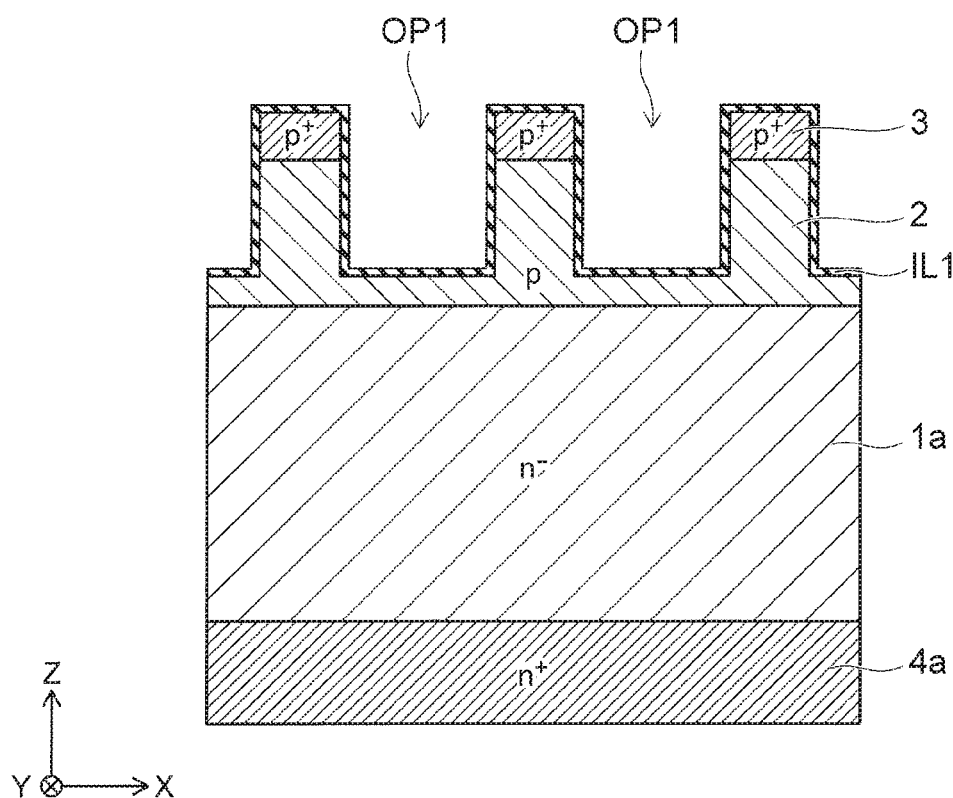
Figure 4A:
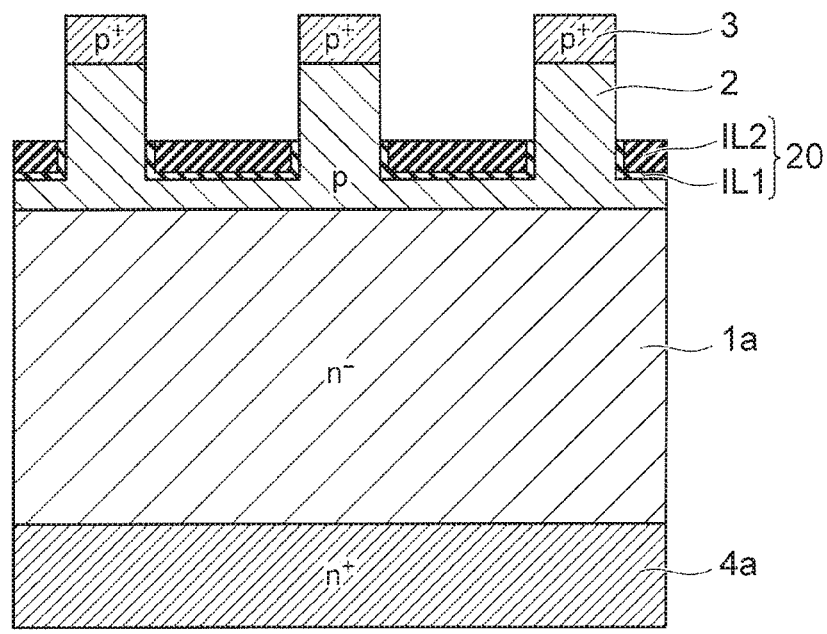
FIGS. 4A and 4B are sectional views showing steps of manufacturing the semiconductor device according to the first embodiment.
Figure 4B:
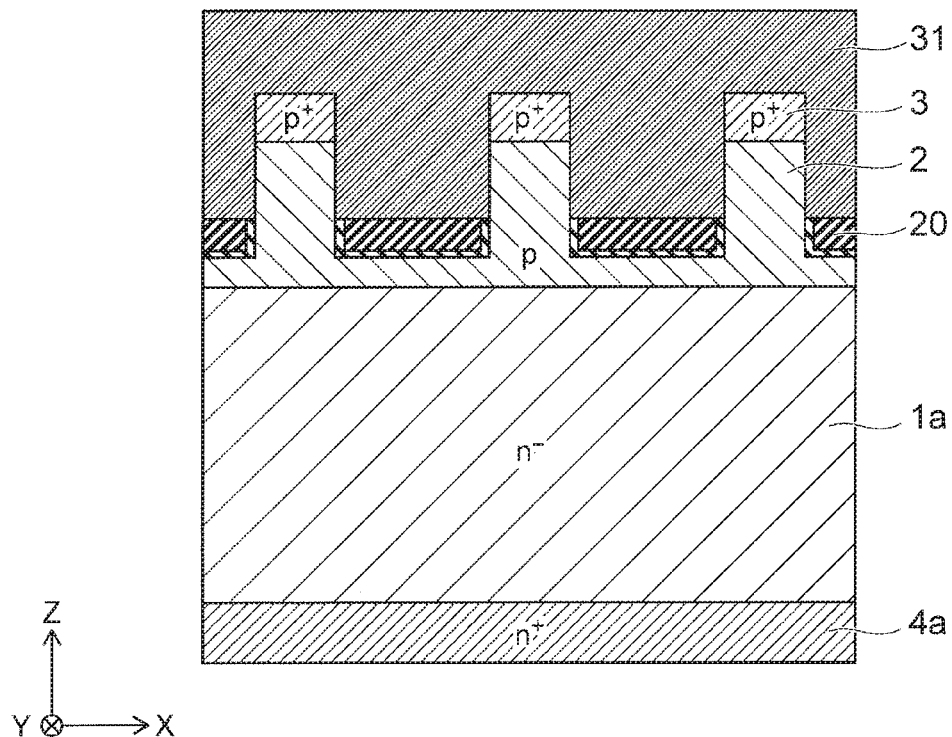

FIGS. 3 to 5 are sectional views showing steps of manufacturing the semiconductor device 100 according to the first embodiment.

First, a semiconductor substrate including an n$^+$ type semiconductor layer 4a and an n$^−$ type semiconductor layer 1a is prepared. The n$^−$ type semiconductor layer 1a is provided on the n$^+$ type semiconductor layer 4a. The p type impurities are then ion-implanted into a surface of the n$^−$ type semiconductor layer 1a to form the p type anode region 2 and the p$^+$ type anode region 3 as shown in FIG. 3A.

Second, a part of the p type anode region 2 and a part of the p$^+$ type anode region 3 are removed to form openings OP1. The surface of the p type anode region 2 and the surface of the p$^+$ type anode region 3 are then thermally oxidized to form an insulating layer IL1 as shown in FIG. 3B.

Third, an insulating layer IL2 is formed on the insulating layer IL1 in a manner that the p type anode region 2 and the p$^+$ type anode region 3 are covered and the openings OP1 are filled. Surfaces of the insulating layers IL1 and IL2 are then recessed by etching (etching-back). By the steps described above, the insulating portion 20 including the insulating layers IL1 and IL2 is formed on a bottom of each opening OP1 as shown in FIG. 4A.

Subsequently, a metal layer is formed on the p$^+$ type anode region 3 and the insulating portion 20 to form the anode electrode 31. Then the back surface of the type semiconductor layer 4a is ground until the n$^+$ type semiconductor layer 4a becomes a predetermined thickness. Then a metal layer is formed on the ground back surface of the n$^+$ type semiconductor layer 4a and the cathode electrode 30 is formed accordingly.

The semiconductor device 100 is produced by the process described above.

Figure 5A:
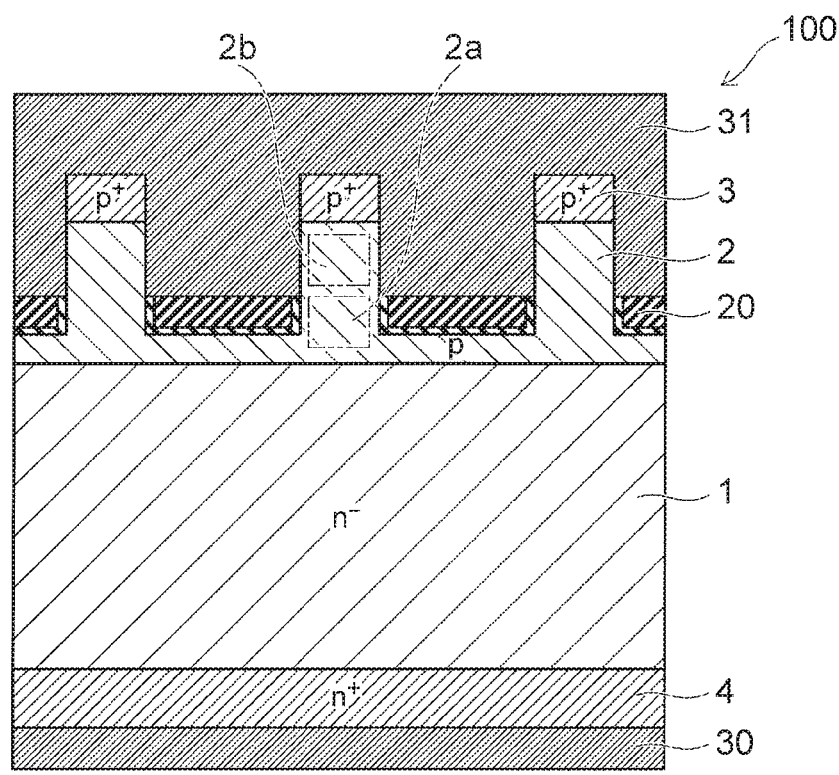
FIGS. 5A and 5B are sectional views showing steps of manufacturing the semiconductor device according to the first embodiment.

When the p type impurities are ion-implanted at a shallow depth in the surface of the n$^−$ type semiconductor layer 1a and then spread in the −Z direction by heat in the step shown in FIG. 3A, a p type impurity concentration in the p type anode region 2 decreases at greater distances in the −Z direction. That is to say, the p type anode region 2 has a first portion 2a and a second portion 2b, and the p type impurity concentration in each portion is different, as shown in FIG. 5A. The first portion 2a is between the second portion 2b and the n$^−$ type semiconductor region 1. The p type impurity concentration in the second portion 2b is higher than that in the first portion 2a.

Figure 5B:
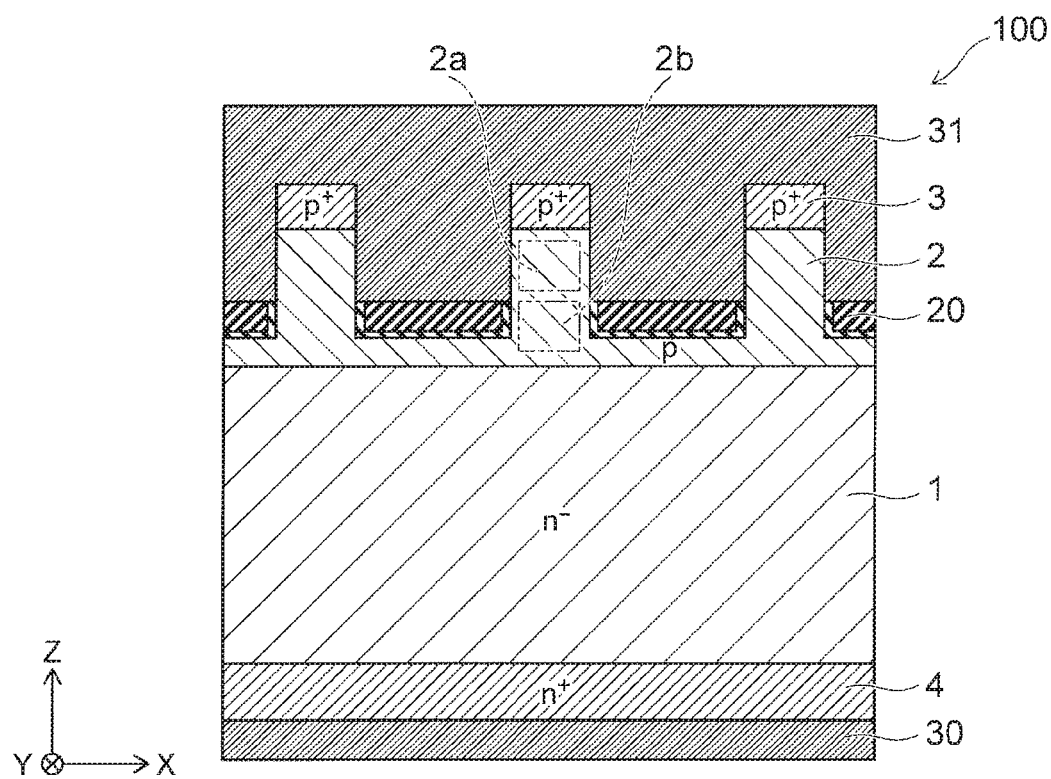

On the other hand, when the p type impurities are ion-implanted deeply into the n$^−$ type semiconductor layer 1a with high energy (high acceleration) in the step shown in FIG. 3A, the p type impurity concentration in a deep portion is higher than that in a shallow portion. That is, the second portion 2b in the p type anode region 2, which has a higher impurity concentration, is between the first portion 2a and the n$^−$ type semiconductor region 1, as shown in FIG. 5B.

Now, the action and effect according to the embodiment will be described.

In the semiconductor device 100 according to the embodiment, the portion 31a of the anode electrode 31 is in contact with the side surfaces of the p type anode region 2, and the p$^+$ type anode region 3 is provided on the p type anode region 2. With this structure, electrons injected from the cathode electrode 30 into the n$^−$ type semiconductor region 1 are attracted to holes injected from the anode electrode 31 into the p$^+$ type anode region 3, when the electrons flow into the anode electrode 31. At this time, the electrons attracted toward the p$^+$ type anode region 3 are discharged from the side surfaces of the p type anode region 2 to the anode electrode 31, because the side surfaces of the p type anode region 2 are in contact with the portion 31a. In particular, the p type anode region 2 is in schottky contact with the anode electrode 31, so that the holes are prevented from being injected from both the side surfaces of the p type anode region 2 and the electrons are efficiently discharged from both the side surfaces of the p type anode region 2.

When the anode electrode 31 has the portion 31a, the distance between the portion 31a and the n$^−$ type semiconductor region 1 is short. This allows conduction to take place easily between the anode electrode 31 and the n$^−$ type semiconductor region 1. Regarding this matter, the embodiment includes the insulating portion 20 between the portion 31a and the n$^−$ type semiconductor region 1 in order to reduce the likelihood that the anode electrode 31 and the n$^−$ type semiconductor region 1 are electrically conducted.

In addition, by forming the insulating portion 20, it becomes possible to increase a distance from a pn junction plane between the n$^−$ type semiconductor region 1 and the p type anode region 2 to an interface between the p type anode region 2 and the anode electrode 31. Because of the increased distance, it is difficult that a depletion layer which extends from the pn junction plane reaches the interface between the p type anode region 2 and the anode electrode 31. Thus, the p type impurity concentration in the p type anode region 2 can be reduced according to the distance increased.

When the p type impurity concentration in the p type anode region 2 decreases, an amount of holes injected from the anode electrode 31 is reduced. Moreover, when the p type impurity concentration in the p type anode region 2 decreases, a schottky barrier between the p type anode region 2 and the anode electrode 31 becomes lower and accordingly more electrons can be discharged to the anode electrode 31. The holes and the electrons are injected from the cathode electrode 30 and the anode electrode 31 in a manner that each density in the n⁻ type semiconductor region 1 becomes approximately equal. Thus, the electrons are discharged efficiently to the anode electrode 31 so that the density of the electrons in the n⁻ type semiconductor region 1 decreases and the holes injected into the n⁻ type semiconductor region 1 are reduced accordingly.

Consequently, it becomes possible to reduce an amount of holes injected into the p type anode region 2 by decreasing the p type impurity concentration in the p type anode region 2. In addition, it is also possible to reduce an amount of holes injected into the p type anode region 2 further more by discharging the electrons more efficiently to the anode electrode 31.

Therefore, the density of the holes in the n⁻ type semiconductor region 1 in an ON state of the semiconductor device can be decreased and a recovery time in an OFF state switched from ON state of the semiconductor device can be shortened.

According to the embodiment, a semiconductor device is provided which can shorten a recovery time.

As described above, according to the embodiment, the insulating portion 20 allows for the reduction of the likelihood of conduction between the anode electrode 31 and the n⁻ type semiconductor region 1, while shortening a recovery time of the semiconductor device.

Second Embodiment

Figure 6:
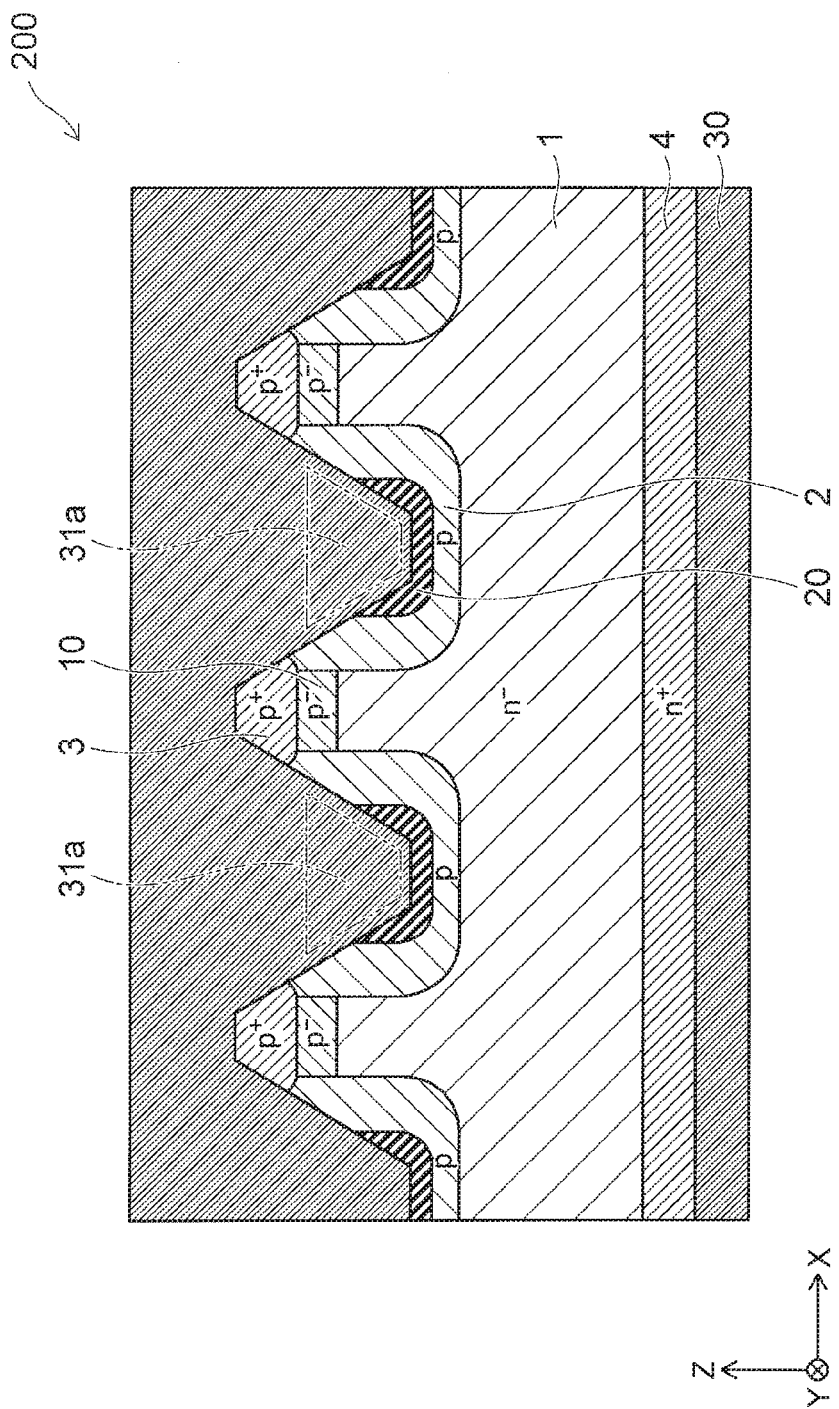
FIG. 6 is a sectional view of a semiconductor device according to a second embodiment.

FIG. 6 is a sectional view of a semiconductor device 200 according to a second embodiment.

The semiconductor device 200 is different from the semiconductor device 100 in the following point. For example, in the semiconductor device 200, a p⁻ type semiconductor region 10 is provided and a contact surface between an anode electrode 31 and each of semiconductor regions is inclined in relation to a Z direction.

In the semiconductor device 200, a p type anode region 2 is provided on a part of an n⁻ type semiconductor region 1, and the p⁻ type semiconductor region 10 is provided on another part of the n⁻ type semiconductor region 1.

A part of the p type anode region 2 extends in the Z direction. An insulating portion 20 is provided on another part of the p type anode region 2.

A p⁺ type anode region 3 is provided on a part of the p type anode region 2 and also on the p⁻ type semiconductor region 10.

A contact surface between the p type anode region 2 and the anode electrode 31 and a contact surface between the p⁺ type anode region 3 and the anode electrode 31 are inclined in relation to the Z direction. The anode electrode 31 has a portion 31a aligned with the p type anode region 2 in an X direction as well as the semiconductor device 100. The insulating portion 20 is located between the portion 31a and the n⁻ type semiconductor region 1 in the Z direction.

According to the embodiment, it is possible to reduce the likelihood of conduction between the anode electrode 31 and the n⁻ type semiconductor region 1 and simultaneously shorten a recovery time of the semiconductor device as well as the first embodiment.

Moreover, according to the embodiment, the contact surface between the p type anode region 2 and the anode electrode 31 is inclined in relation to the Z direction and increases its area accordingly, compared with the case that the interface is in parallel to the Z direction. Accordingly, electrons that are discharged to the anode electrode 31 can be increased and the recovery time of the semiconductor device can be shortened further more.

Third Embodiment

Figure 7:
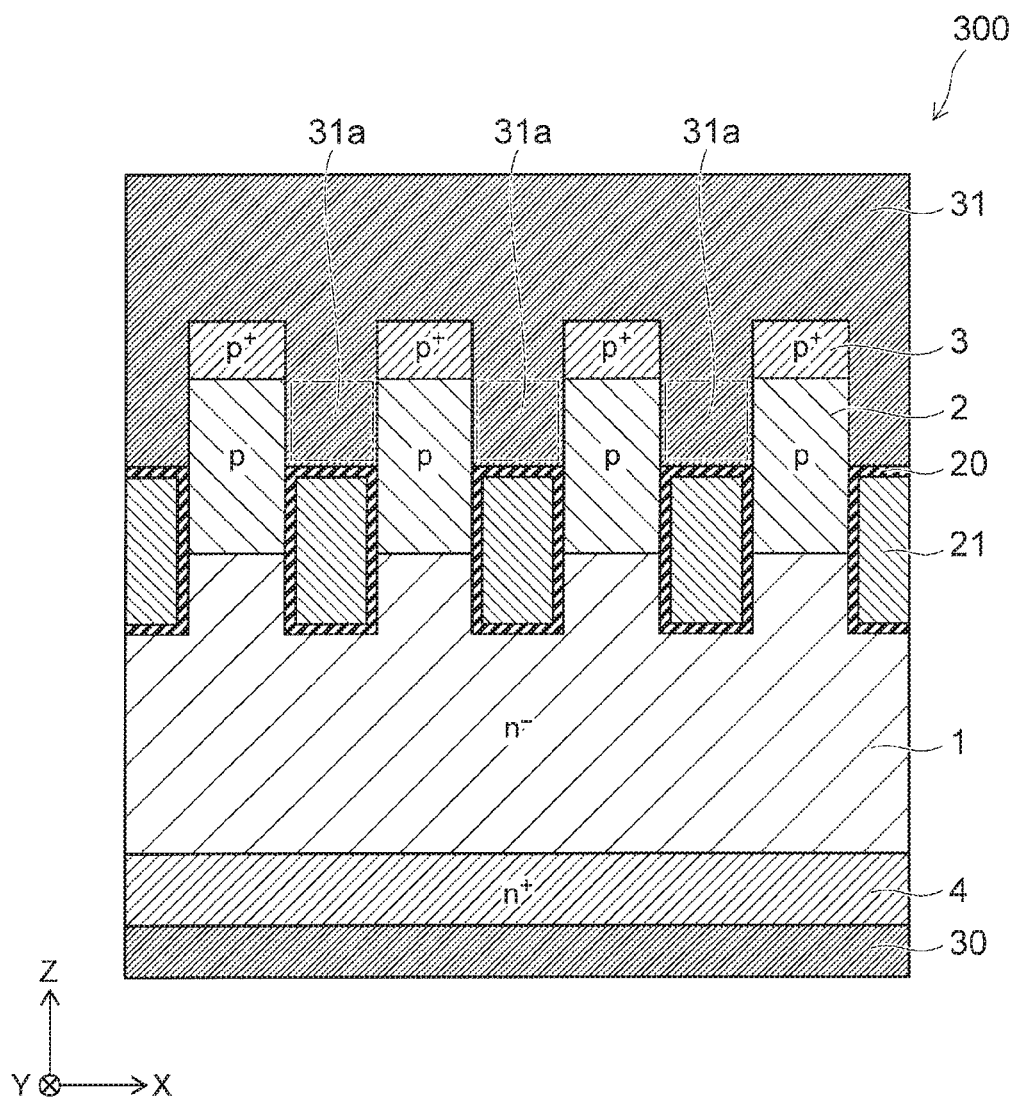
FIG. 7 is a sectional view of a semiconductor device according to a third embodiment.

FIG. 7 is a sectional view of a semiconductor device 300 according to a third embodiment.

The semiconductor device 300 is different from the semiconductor device 100, for example, in including a conductive portion 21.

The conductive portion 21 is provided to be surrounded by an insulating portion 20 so that it is separated from an n⁻ type semiconductor region 1 and a p type anode region 2. The conductive portion 21 is aligned with the n⁻ type semiconductor region 1 and the p type anode region 2 in an X direction. The conductive portion 21 is also electrically connected to an anode electrode 31. The conductive portion 21 includes a conductive material, such as polysilicon.

Including the conductive portion 21 electrically connected to the anode electrode 31 causes a depletion layer to extend from a boundary between the insulating portion 20 and the n⁻ type semiconductor region 1 to the n⁻ type semiconductor region 1, when the semiconductor device is turned off. This prevents a depletion layer from extending from a pn junction plane between the n⁻ type semiconductor region 1 and the p type anode region 2 to the p type anode region 2. Since the depletion layer is prevented from extending, the p type impurity concentration in the p type anode region 2 can be decreased further more. As a result of this, compared with the semiconductor device 100, the semiconductor device 300 can decrease the density of the holes in the n⁻ type semiconductor region 1 more in an ON state, thereby shorten a recovery time further more.

Fourth Embodiment

Figure 8:
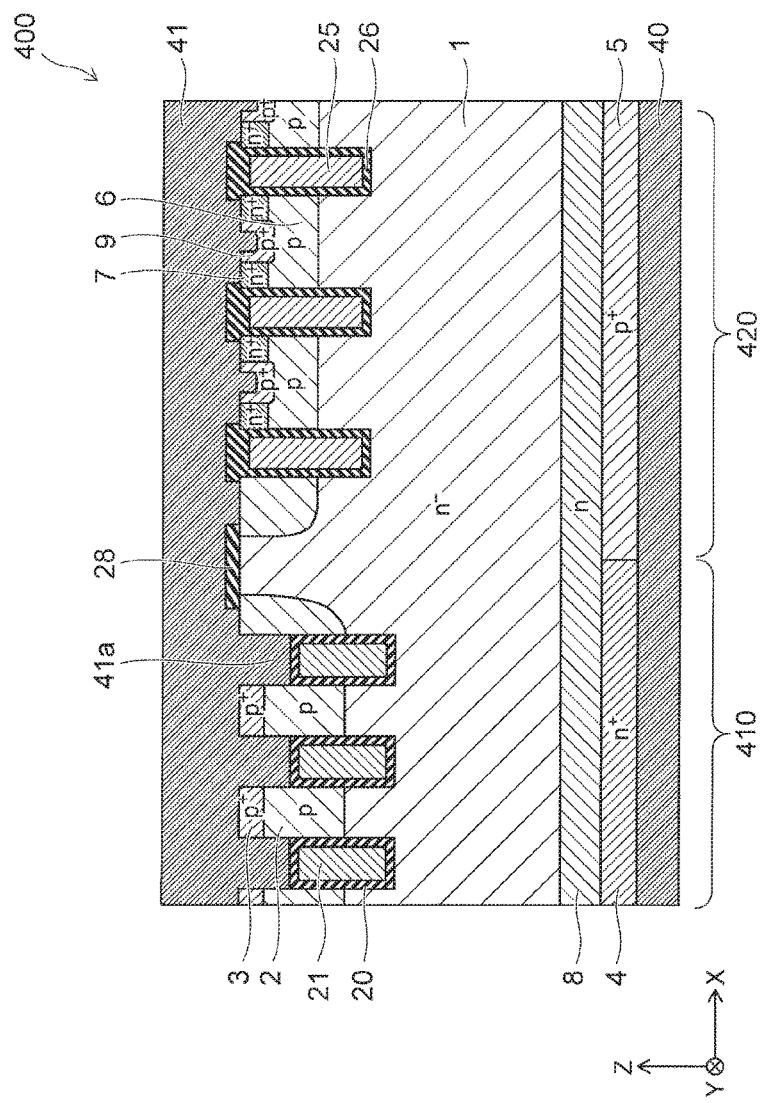
FIG. 8 is a sectional view of a semiconductor device according to a fourth embodiment.

FIG. 8 is a sectional view of a semiconductor device 400 according to a fourth embodiment.

The semiconductor device 400 is, for example, a Reverse Conducting-Insulated Gate Bipolar Transistor (RC-IGBT).

As shown in FIG. 8, the semiconductor device 400 includes an n⁺ type cathode region 4 (fourth semiconductor region), a p⁺ type collector region 5 (fifth semiconductor region), an n type semiconductor region 8, an n⁻ type semiconductor region 1 (first semiconductor region), a p type anode region 2 (second semiconductor region), a p⁺ type anode region 3 (third semiconductor region), a p type base region 6 (sixth semiconductor region), an n⁺ type emitter region 7 (seventh semiconductor region), a p⁺ type contact region 9, an insulating portion 20, a conductive portion 21, a gate electrode 25, a gate insulating layer 26, an insulating layer 28, a collector electrode 40 (second electrode), and an emitter electrode 41 (first electrode).

The semiconductor device 400 includes a diode region 410 and an IGBT region 420.

The n⁺ type cathode region 4, the p type anode region 2, the p⁺ type anode region 3, the insulating portion 20, and the conductive portion 21 are provided in the diode region 410. That is, the semiconductor device 400 includes the semiconductor device 300 according to the third embodiment in the diode region 410.

The p⁺ type collector region 5, the p type base region 6, the n⁺ type emitter region 7, the p⁺ type contact region 9, the gate electrode 25, and the gate insulating layer 26 are provided in the IGBT region 420.

The collector electrode 40 is provided on a back surface of the semiconductor device 400.

The n⁺ type cathode region 4 is provided on a part of the collector electrode 40.

The p⁺ type collector region 5 is provided on another part of the collector electrode 40.

The n type semiconductor region 8 is provided on the n⁺ type cathode region 4 and the p⁺ type collector region 5.

The n⁻ type semiconductor region 1 is provided on the n type semiconductor region 8.

The p type anode region 2 is provided on a part of the n⁻ type semiconductor region 1.

The insulating portion 20 is provided on another part of the n⁻ type semiconductor region 1. The conductive portion 21 is surrounded by the insulating portion 20.

The p⁺ type anode region 3 is provided on the p type anode region 2. The p type anode region 2, the p⁺ type anode region 3, and the insulating portion 20 are located above the n⁺ type cathode region 4.

The p type base region 6 is provided on the n⁻ type semiconductor region 1 in a manner that it is separated from the p type anode region 2 and the insulating portion 20. The p type base region 6 is located above the p⁺ type collector region 5.

Each of the n⁺ type emitter region 7 and the p⁺ type contact region 9 is selectively provided on the p type base region 6.

The gate insulating layer 26 is provided between the gate electrode 25 and each of the n⁻ type semiconductor region 1, the p type base region 6, and the n⁺ type emitter region 7.

The insulating layer 28 is provided on a part of the n⁻ type semiconductor region 1 which is between the p type anode region 2 and the p type base region 6, and is provided across from the p type anode region 2 to the p type base region 6.

The emitter electrode 41 is provided on a surface of the semiconductor device 400 and covers the p⁺ type anode region 3, the insulating portion 20, the n⁺ type emitter region 7, and p⁺ type contact region 9. The emitter electrode 41 is in contact with the p type anode region 2, the p⁺ type anode region 3, the n⁺ type emitter region 7, and the p⁺ type contact region 9. The emitter electrode 41 also has a portion 41a aligned with the p type anode region 2 in an X direction.

The gate insulating layer 26 is provided between the emitter electrode 41 and the gate electrode 25, and these electrodes are electrically separated from each other.

When a voltage equal to or more than a threshold value is applied to the gate electrode 25, a channel (inversion region) is formed in a region near an interface with the gate insulating layer 26 in the p type base region 6. When the channel is formed in a condition that a positive voltage is applied to the collector electrode 40 relative to the emitter electrode 41, the IGBT becomes an ON state. Subsequently, when the voltage in the gate electrode 25 becomes less than the threshold voltage, the channel the p type base region 6 disappears and the IGBT turned to be an OFF state.

In a typical power conversion circuit, a plurality of RC-IGBTs are used for forming a bridge circuit. When the IGBT region 420 of one of the RC-IGBTs becomes in a conductive state, a current flows into a load connected to the circuit. The load typically is an inductance.

When the IGBT region 420 becomes an OFF state, the current flowed in the load flows into the collector electrode 40 from the emitter electrode 41 in the diode region 410 of another one of the RC-IGBTs which is connected in parallel with the load. Then, when the IGBT region 420 of the one of the RC-IGBT which has been turned off becomes in an ON state, carriers accumulated in the n⁻ type semiconductor region 1 in the diode region 410 are discharged, and a depletion layer extends.

The semiconductor device 400 includes the semiconductor device 300 according to the third embodiment in the diode region 410 so that a recovery time in the diode region 410 can be shortened when the IGBT region 420 becomes in an ON state.

The insulating portion 20 and the conductive portion 21 also can be formed by the same process as the gate electrode 25 and the gate insulating layer 26. That is to say, applying the configuration of the semiconductor device 300 according to the third embodiment to the semiconductor device 400 allows the number of steps required for manufacturing not to be increased. In addition to that, it becomes possible to shorten the recovery time efficiently.

Here in FIG. 8, an example is described which has a trench gate type IGBT in which the gate electrode 25 extends in the Z direction and is positioned to face to the p type base region 6 in the X direction. The embodiment, however, is not limited to this. The semiconductor device 400 may include, for example, a planer gated type IGBT in which the gate electrode 25 is positioned to face to the p type base region 6 in the Z direction.

Moreover, not limited to the example described in FIG. 8, the semiconductor device 400 may include the semiconductor device according to the first embodiment or the second embodiment in the diode region 410.

The relative level of the impurity concentration among individual semiconductor regions in each embodiment described above can be checked using a scanning electrostatic capacity microscope (SCM). In addition, the carrier concentration in each semiconductor region is regarded as the same as the impurity concentration that is activated in each semiconductor region. Accordingly, the relative level of the carrier concentration among individual semiconductor regions also can be checked using the SCM.

Moreover, the impurity concentration in each semiconductor region can be measured by, for example, a secondary ion mass spectroscopy (SIMS).

Specific configuration of each element, including the n⁺ type cathode region 4, the p⁺ type collector region 5, the n type semiconductor region 8, the n⁻ type semiconductor region 1, the p type anode region 2, the p⁺ type anode region 3, the p type base region 6, the n⁺ type emitter region 7, the p⁺ type contact region 9, the insulating portion 20, the conductive portion 21, the gate electrode 25, the gate insulating layer 26, the cathode electrode 30, the anode electrode 31, the collector electrode 40, or the emitter electrode 41, may be appropriately selected from known techniques by a person skilled in the art.

The embodiments explained above can be combined with each other to be carried out.

While certain embodiments have been described, these embodiments have been presented by way of example only, and are not intended to limit the scope of the inventions. Indeed, the novel embodiments described herein may be embodied in a variety of other forms; furthermore, various omissions substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first semiconductor region of a first conductivity type;
a second semiconductor region of a second conductivity type provided on the first semiconductor region;

an insulating portion provided on the first semiconductor region;

a third semiconductor region of the second conductivity type provided on the second semiconductor region and having a higher carrier concentration of the second conductivity type than that of the second semiconductor region; and a first electrode provided on the insulating portion and the third semiconductor region, the first electrode having a portion which is aligned with the second semiconductor region in a second direction perpendicular to a first direction being from the first semiconductor region to the second semiconductor region, and the first electrode being in contact with the second semiconductor region and the third semiconductor region, wherein a part of the second semiconductor region is provided between the first semiconductor region and the insulating portion in the first direction.

2. The semiconductor device, according to claim 1, further comprising:

a conductive portion surrounded by the insulating portion.

3. The semiconductor device, according to claim 2, wherein the conductive portion is electrically connected to the first electrode.

4. The semiconductor device, according to claim 1, wherein a contact surface between the second semiconductor region and the first electrode is inclined in relation to the first direction.

5. The semiconductor device, according to claim 1, wherein the third semiconductor region extends in a direction perpendicular to the first direction.

6. The semiconductor device, according to claim 1, wherein a plurality of the third semiconductor regions is provided in two directions perpendicular to the first direction.

7. The semiconductor device, according to claim 1, wherein the first electrode is in schottky contact with the second semiconductor region and is in ohmic contact with the third semiconductor region.

8. A semiconductor device comprising:

a first semiconductor region of a first conductivity type;

a second semiconductor region of a second conductivity type provided on the first semiconductor region;

an insulating portion provided on the first semiconductor region;

a third semiconductor region of the second conductivity type provided on the second semiconductor region and having a higher carrier concentration of the second conductivity type than that of the second semiconductor region;

a first electrode provided on the insulating portion and the third semiconductor region, the first electrode having a portion which is aligned with the second semiconductor region in a second direction perpendicular to a first direction being from the first semiconductor region to the second semiconductor region, and the first electrode being in contact with the second semiconductor region and the third semiconductor region; and a conductive portion surrounded by the insulating portion, wherein a part of the second semiconductor region is provided between the first semiconductor region and the insulating portion in the first direction.

9. The semiconductor device, according to claim 8, wherein a contact surface between the second semiconductor region and the first electrode is inclined in relation to the first direction.

10. The semiconductor device, according to claim 8, wherein the first electrode is in schottky contact with the second semiconductor region and is in ohmic contact with the third semiconductor region.

11. A semiconductor device comprising:

a second electrode;

a fourth semiconductor region of a first conductivity type provided on the second electrode;

a fifth semiconductor region of a second conductivity type provided on the second electrode;

a first semiconductor region of the first conductivity type provided above the fourth semiconductor region and the fifth semiconductor region;

a second semiconductor region of the second conductivity type provided on a part of the first semiconductor region and located above the fourth semiconductor region;

an insulating portion provided on another part of the first semiconductor region and located above the fourth semiconductor region;

a third semiconductor region of the second conductivity type provided on the second semiconductor region and having a higher carrier concentration of the second conductivity type than the second semiconductor region;

a sixth semiconductor region of the second conductivity type provided on the first semiconductor region, separated from the second semiconductor region and the insulating portion, and located above the fifth semiconductor region;

a seventh semiconductor region of the first conductivity type selectively provided on the sixth semiconductor region;

a gate electrode;

a gate insulating layer provided between the gate electrode and each of the first semiconductor region, the sixth semiconductor region, and the seventh semiconductor region; and a first electrode provided on the insulating portion, the third semiconductor region, and the seventh semiconductor region, the first electrode having a portion aligned with the second semiconductor region in a second direction perpendicular to a first direction being from the first semiconductor region to the second semiconductor region, and the first electrode being in contact with the second semiconductor region, the third semiconductor region, and the seventh semiconductor region.

12. The semiconductor device, according to any of claim 11, wherein the first electrode is in shotkey contact with the second semiconductor region and is in ohmic contact with the third semiconductor region.

13. The semiconductor device, according to claim 11, further comprising:
   a conductive portion surrounded by the insulating portion.

14. The semiconductor device, according to claim 13, wherein
   the conductive portion is electrically connected to the first electrode.

15. The semiconductor device, according to claim 11, wherein
   a contact surface between the second semiconductor region and the first electrode is inclined in relation to the first direction.

16. The semiconductor device, according to claim 11, wherein
   a part of the second semiconductor region is provided between the first semiconductor region and the insulating portion in the first direction.

17. The semiconductor device, according to claim 11, wherein
   the third semiconductor region extends in a direction perpendicular to the first direction.

18. The semiconductor device, according to claim 11, wherein
   a plurality of the third semiconductor regions is provided in two directions perpendicular to the first direction.

* * * * *